(12) United States Patent
Parthasarathy et al.

(10) Patent No.: US 9,634,482 B2
(45) Date of Patent: Apr. 25, 2017

(54) APPARATUS AND METHODS FOR TRANSIENT OVERSTRESS PROTECTION WITH ACTIVE FEEDBACK

(71) Applicant: Analog Devices, Inc., Norwood, MA (US)

(72) Inventors: Srivatsan Parthasarathy, Acton, MA (US); Javier Alejandro Salcedo, North Billerica, MA (US); Sandro Herrera, Medford, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 213 days.

(21) Appl. No.: 14/335,665

(22) Filed: Jul. 18, 2014

(65) Prior Publication Data
US 2016/0020603 A1    Jan. 21, 2016

(51) Int. Cl.
*H02H 9/00*    (2006.01)
*H01L 27/02*    (2006.01)
(Continued)

(52) U.S. Cl.
CPC ......... *H02H 9/005* (2013.01); *H01L 27/0285* (2013.01); *H02H 9/046* (2013.01)

(58) Field of Classification Search
CPC ....... H02H 9/005; H02H 9/02; H01L 27/0285
(Continued)

(56) References Cited

U.S. PATENT DOCUMENTS

| | | |
|---|---|---|
| 5,719,733 A | 2/1998 | Wei et al. |
| 5,748,425 A | 5/1998 | Gutsch et al. |

(Continued)

FOREIGN PATENT DOCUMENTS

| | | |
|---|---|---|
| CN | 201536104 U | 7/2010 |
| CN | 102118024 A | 7/2011 |

(Continued)

OTHER PUBLICATIONS

Salcedo et al., Electrostatic Discharge Protection Framework for Mixed-Signal High Voltage CMOS Applications. 9th International Conference on Solid-State and Integrated-Circuit Technology, Oct. 2008. 4 pages.

(Continued)

*Primary Examiner* — Thienvu Tran
*Assistant Examiner* — Kevin J Comber
(74) *Attorney, Agent, or Firm* — Knobbe Martens Olson & Bear LLP

(57) ABSTRACT

Apparatus and methods for providing transient overstress protection with active feedback are disclosed. In certain configurations, a protection circuit includes a transient detection circuit, a bias circuit, a clamp circuit, and a sense feedback circuit that generates a positive feedback current when the clamp circuit is clamping. The transient detection circuit can detect a presence of a transient overstress event, and can generate a detection current in response to detection of the transient overstress event. The detection current and the positive feedback current can be combined to generate a combined current, and the bias circuit can turn on the clamp circuit in response to the combined current. While the transient overstress event is present and the clamp circuit is clamping, the sense feedback circuit can generate the positive feedback current to maintain the clamp circuit turned on for the event's duration.

20 Claims, 8 Drawing Sheets

(51) Int. Cl.
  *H02H 9/02* (2006.01)
  *H02H 9/04* (2006.01)
(58) Field of Classification Search
  USPC .......................................................... 361/56
  See application file for complete search history.

(56) References Cited

U.S. PATENT DOCUMENTS

| | | | |
|---|---|---|---|
| 5,835,328 | A | 11/1998 | Maloney et al. |
| 5,870,268 | A | 2/1999 | Lin et al. |
| 6,429,489 | B1 | 8/2002 | Botula et al. |
| 6,442,008 | B1 | 8/2002 | Anderson |
| 6,614,633 | B1 | 9/2003 | Kohno |
| 7,064,393 | B2 | 6/2006 | Mergens et al. |
| 7,102,862 | B1 | 9/2006 | Lien et al. |
| 7,706,113 | B1 | 4/2010 | Lien et al. |
| 7,738,222 | B2 | 6/2010 | Deutschmann et al. |
| 8,320,091 | B2 | 11/2012 | Salcedo et al. |
| 8,345,394 | B2 | 1/2013 | Zhao et al. |
| 8,422,187 | B2 | 4/2013 | Parthasarathy et al. |
| 8,582,261 | B2 | 11/2013 | Salcedo et al. |
| 8,649,134 | B2 | 2/2014 | Smith |
| 8,730,630 | B2 | 5/2014 | Parthasarathy et al. |
| 8,958,187 | B2 | 2/2015 | Parthasarathy et al. |
| 9,293,912 | B2 | 3/2016 | Parthasarathy et al. |
| 2002/0153571 | A1 | 10/2002 | Mergens et al. |
| 2004/0114288 | A1 | 6/2004 | Cheng et al. |
| 2006/0103998 | A1 | 5/2006 | Smith |
| 2007/0076338 | A1 | 4/2007 | Traynor et al. |
| 2008/0106837 | A1 | 5/2008 | Jang |
| 2008/0247102 | A1 | 10/2008 | Vinson |
| 2008/0304191 | A1 | 12/2008 | Riviere et al. |
| 2008/0316659 | A1 | 12/2008 | Oguzman et al. |
| 2010/0148797 | A1 | 6/2010 | Ker et al. |
| 2010/0214706 | A1 | 8/2010 | Crespo et al. |
| 2011/0222196 | A1 | 9/2011 | Smith |
| 2011/0235228 | A1 | 9/2011 | Salcedo et al. |
| 2012/0002337 | A1* | 1/2012 | Parthasarathy ..... H01L 27/0259 361/111 |
| 2012/0057260 | A1 | 3/2012 | Poulton |
| 2012/0180008 | A1* | 7/2012 | Gist, III .............. H01L 27/0285 716/101 |
| 2013/0155558 | A1 | 6/2013 | Bourgeat et al. |
| 2014/0133055 | A1 | 5/2014 | Parthasarathy et al. |

FOREIGN PATENT DOCUMENTS

| | | |
|---|---|---|
| EP | 1617477 A1 | 1/2006 |
| EP | 1048078 B1 | 5/2010 |
| TW | 577166 B | 2/2004 |
| WO | WO 2009/050641 | 4/2009 |

OTHER PUBLICATIONS

Extended European Search Report for European Patent Application No. 15174864.7, dated Nov. 12, 2015 in 5 pages.

* cited by examiner

APPARATUS AND METHODS FOR TRANSIENT OVERSTRESS PROTECTION WITH ACTIVE FEEDBACK

BACKGROUND

Field

Embodiments of the invention relate to electronic systems, and more particularly, to transient overstress protection circuits.

Description of the Related Technology

Certain electronic systems can be exposed to transient overstress events, or electrical signals of short duration having rapidly changing voltage and high power. Transient overstress events can include, for example, electrostatic discharge (ESD) events arising from the abrupt release of charge from an object or person to an electronic system.

Transient overstress events can destroy integrated circuits (ICs) due to overvoltage conditions and high levels of power dissipation in relatively small areas of the ICs. High power dissipation can increase IC temperature, and can lead to numerous problems, such as gate oxide punch-through, junction damage, metal damage, and surface charge accumulation.

SUMMARY

In one aspect, an apparatus includes a transient detection circuit configured to generate a detection current in response to a transient overstress event detected between a first node and a second node, a clamp circuit having an on state and an off state, wherein a shunt current flows through the clamp circuit between the first node and the second node when the clamp circuit operates in the on state, a sense feedback circuit configured to generate a positive feedback current based on the shunt current, and a bias circuit configured to receive a combined current. The combined current is based on a sum of the detection current and the positive feedback current, and the bias circuit is configured to control operation of the clamp circuit in the on state or the off state based on the combined current.

In another aspect, an integrated circuit includes a first contact, a second contact, an internal circuit electrically connected between the first and second contacts, and a protection circuit. The protection circuit includes a transient detection circuit configured to generate a detection current in response to a transient overstress event detected between the first and second contacts, a clamp circuit electrically connected between the first and second contacts, wherein a shunt current flows through the clamp circuit when the clamp circuit is turned on, a sense feedback circuit configured to generate a positive feedback current based on the shunt current, and a bias circuit configured to receive a combined current corresponding to a sum of the detection current and the positive feedback current. The bias circuit is configured to turn on or turn off the clamp circuit based on the combined current.

In another aspect, a method for protecting an integrated circuit from transient overstress events is provided. The method includes detecting a presence of a transient overstress event between a first node and a second node using a transient detection circuit, generating a detection current in response to the transient overstress event using the transient detection circuit, combining the detection current with a positive feedback current to generate a combined current, controlling a clamp circuit to an on state or an off state based on the combined current using a bias circuit, wherein a shunt current flows through the clamp circuit between the first node and the second node when the clamp circuit is in the on state, and generating the positive feedback current based on the shunt current using a sense feedback circuit.

DETAILED DESCRIPTION OF EMBODIMENTS

Figure 1:
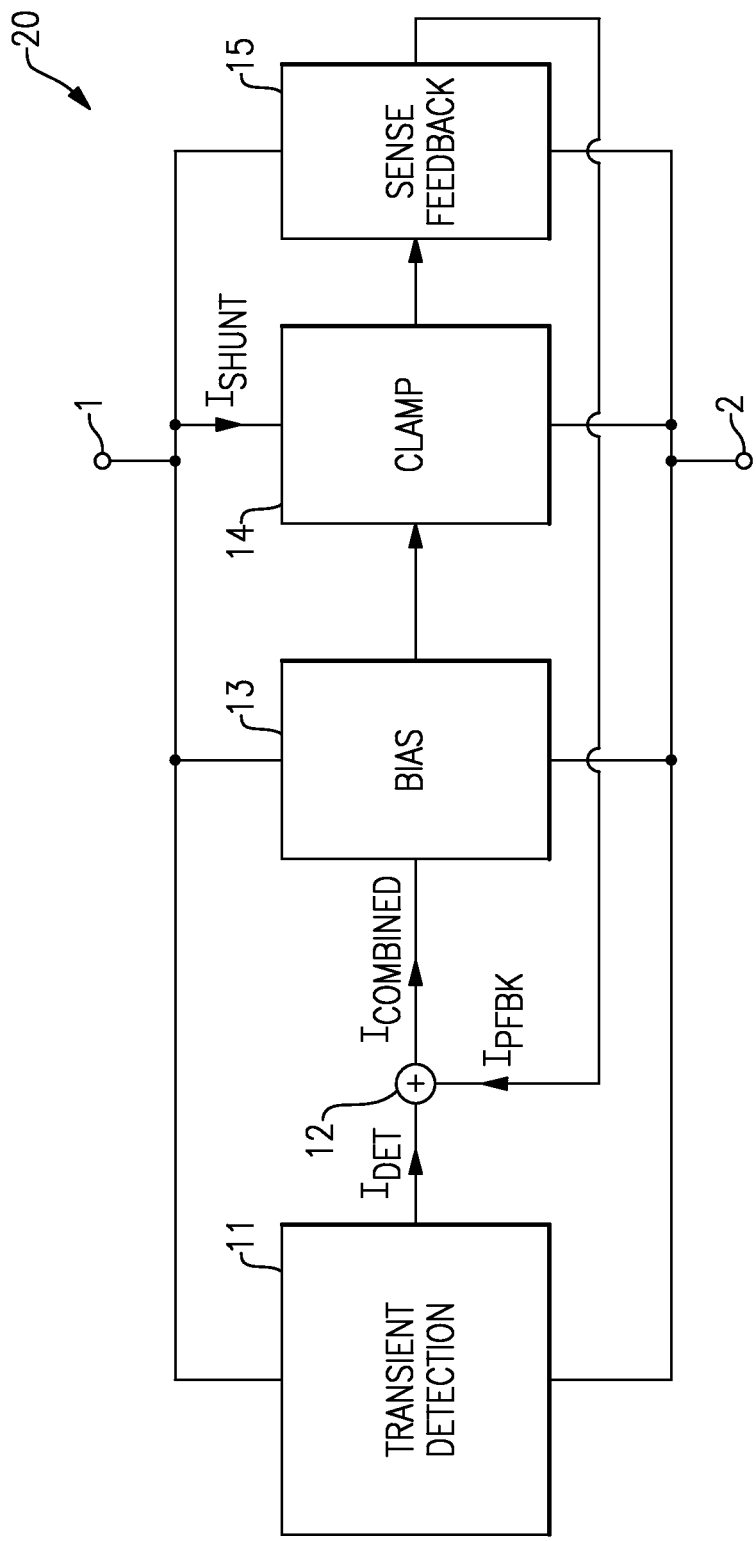
FIG. 1 is a schematic block diagram of an actively-controlled protection circuit according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

Certain electronic systems include protection circuits to protect circuits or components therein from transient overstress events. Furthermore, to help guarantee that an electronic system is reliable, manufacturers can test the electronic system under defined stress conditions, which can be described by standards set by various organizations, such as the Joint Electronic Device Engineering Council (JEDEC), the International Electrotechnical Commission (IEC), and the Automotive Engineering Council (AEC). The standards can cover a wide multitude of transient overstress events, including ESD events.

Overview of Examples of Transient Overstress Protection Circuits with Active Feedback Apparatus and methods for transient overstress protection circuits with active feedback are provided herein. In certain configurations, a protection circuit includes a transient detection circuit, a bias circuit, a clamp circuit, and a sense feedback circuit that generates a positive feedback current when the clamp circuit is clamping. The transient detection circuit can detect a presence of a transient overstress event received between a first node and a second node, and can generate a detection current in response to detection of the transient overstress event. The detection current and the positive feedback current can be combined to generate a combined current. Additionally, the bias circuit can receive the combined current, and can turn on or activate the clamp circuit in response to the combined current. Accordingly, when the transient detection circuit detects the transient overstress event, the bias circuit can turn on the clamp circuit to provide a low impedance path between the first and second nodes. Additionally, while the transient overstress event is present and the clamp circuit is clamping, the sense feedback circuit can generate the positive feedback current, which can maintain the clamp circuit turned on for the duration of the transient overstress event.

By providing positive feedback in this manner, the sense feedback circuit can dynamically control a duration that the clamp circuit is activated during a transient overstress event. In particular, during the transient overstress event, the sense feedback circuit can provide positive feedback that can maintain the clamp circuit turned on while a shunt current of a sufficient magnitude is flowing through the clamp circuit, even after the transient detection circuit turns off the detection current. Thus, the clamp circuit can be turned on for a duration that is independent of a time constant of the transient detection circuit.

The actively-controlled protection circuits herein can provide robust overvoltage protection, including, for example, robust protection during a tail-end of an ESD event. Including such protection circuits in an IC can enable higher voltage operation with low voltage devices, including, for example, thin oxide field effect transistors (FETs) and/or voltage-sensitive heterojunction bipolar transistors, such as silicon germanium (SiGe) bipolar transistors.

FIG. 1 is a schematic block diagram of an actively-controlled protection circuit 20 according to one embodiment. The protection circuit 20 includes a transient detection circuit 11, a current combining node 12, a bias circuit 13, a clamp circuit 14, and a sense feedback circuit 15. The protection circuit 20 provides transient overstress protection between a first node 1 and a second node 2.

In certain implementations, the first and second nodes 1, 2 can correspond to a power high supply pin or contact and a power low supply contact, respectively, of an integrated circuit (IC). Thus, the protection circuit 20 can be used to provide transient overstress protection to the IC's power supply rails. However, other configurations are possible, including, for example, configurations, in which the protection circuit 20 provides protection between an input/output (I/O) contact and a power low supply contact, between a power high supply contact and an I/O contact, and/or between a first I/O contact and a second I/O contact.

The transient detection circuit 11 is electrically connected between the first and second nodes 1, 2, and generates a detection current $I_{DET}$ in response to detection of a transient overstress event between the first and second nodes 1, 2. For example, in certain configurations, the transient detection circuit 11 can observe a rate of voltage change between the first and second nodes 1, 2, and can generate the detection current $I_{DET}$ when a qualifying transient overstress event is detected. However, the transient detection circuit 11 can detect a transient overstress event based on a multitude of detection conditions indicative of a transient overstress event's potential to damage sensitive electronics, including, but not limited to, measurements of power, voltage, current, and/or charge.

In certain implementations, the transient detection circuit 11 can be configured to generate the detection current $I_{DET}$ when the transient detection circuit 11 detects a rapidly changing voltage for a sufficient period of time on the first node 1 and/or second node 2. For instance, the transient detection circuit 11 can be configured to activate for transient overstress events having a rate of voltage change in the range of about 0.1 V/ns to about 100 V/ns for a length of time in the range of about 1 ns to about 1000 ns. In the presence of nominal signaling conditions on the first and second nodes 1, 2, including, for example, signaling conditions associated with IC power-up, the transient detection circuit 11 can control the detection current $I_{DET}$ to a level associated with no detection of a transient overstress event, for instance, a current level of about 0 mA.

In certain configurations, the transient detection circuit 11 can generate the detection current $I_{DET}$ after detecting a transient overstress event, and the detection current $I_{DET}$ can remain active for a predetermined time, for example, a time ranging between about 1 ns to about 1000 ns. In certain implementations, the duration that the detection current $I_{DET}$ remains active after the transient detection circuit 11 detects a transient overstress event can be based on a time constant of the transient detection circuit 11, such as a resistor-capacitor (RC) time constant.

In the illustrated configuration, the bias circuit 13 can turn on or off the clamp circuit 14 based on a combined current $I_{COMBINED}$ corresponding to a sum of the detection current $I_{DET}$ from the transient detection circuit 11 and a positive feedback current $I_{PFBK}$ from the sense feedback circuit 15. When the detection current $I_{DET}$ is being generated by the transient detection circuit 11, the combined current $I_{COMBINED}$ can have a current level sufficient for the bias circuit 13 to turn on the clamp circuit 14 to provide a low impedance path between the first and second nodes 1, 2.

However, prior to detection of a transient overstress event, the clamp circuit 14 can operate in a low-leakage/high-impedance state (or OFF state). The OFF state impedance can be in, for example, the range of about 0.1 GΩ to about 10 GΩ, thereby providing low static power dissipation when the protection circuit 20 is inactive. Upon detection of a transient overstress event satisfying one or more signaling conditions, such as a particular rate of voltage change, the transient detection circuit 11 can generate the detection current $I_{DET}$ for a particular duration of time. Thereafter, the bias circuit 13 can turn on the clamp circuit 14 in response to the detection current $I_{DET}$. When the clamp circuit 14 is turned on, the clamp circuit 14 can operate in a high-current/low-impedance state (or ON state) in which the clamp circuit 14 provides a low impedance path from the first node 1 to the second node 2. In certain configurations, the ON state impedance of the clamp circuit 14 can be in the range of about 1Ω to about 10Ω.

When the clamp circuit 14 is turned on and a transient overstress event is present, a shunt current $I_{SHUNT}$ can flow between the first and second nodes 1, 2 through the low impedance path provided by the clamp circuit 14. The shunt current $I_{SHUNT}$ can be used to prevent overvoltage conditions on the first node 1 by shunting charge that may otherwise lead to voltage build-up and IC damage.

The clamp circuit 14 can be implemented in a variety of ways. For example, the clamp circuit 14 can include one or more bipolar transistors and/or field-effect transistors (FETs) that turn on in response to a bias signal generated by the bias circuit 13. In certain configurations, the clamp circuit 14 can include two or more transistors that are stacked or arranged in series between the first node 1 and the second node 2 to limit a maximum voltage across each transistor when a transient overstress event is not present between the first and second nodes 1, 2.

Although the transient detection circuit 11 can serve to detect the arrival and/or presence of a transient overstress event, the transient detection circuit 11 may not remain active for the event's full duration. For instance, in one example, the transient detection circuit 11 may be implemented to activate the detection current $I_{DET}$ for a preselected amount of time. In another example, a transient overstress event may have a rate of voltage change that may be too small for the transient detection circuit 11 to detect toward an end of the transient overstress event. For example, the transient detection circuit 11 may be implemented with detection margin to prevent false activation in response to transient activity that is not a transient overstress event, and thus may generate the detection current $I_{DET}$ only when a detected rate of voltage change is relatively large.

Accordingly, the transient detection circuit 11 may deactivate the detection current $I_{DET}$ prior to the completion of a transient overstress event. When the clamp circuit 14 deactivates with the transient overstress event still present, overvoltage conditions can arise, which in turn can lead to IC damage.

The protection circuit 20 includes the sense feedback circuit 15, which can prevent the clamp circuit 14 from deactivating prematurely by generating a positive feedback current $I_{PFBK}$ that is based on the shunt current $I_{SHUNT}$ through the clamp circuit 14.

As shown in FIG. 1, the positive feedback current $I_{PFBK}$ can be combined with the detection current $I_{DET}$ at the current combining node 12 to generate the combined current $I_{COMBINED}$. The detection current $I_{DET}$ and the positive feedback current $I_{PFBK}$, alone or in combination, can provide sufficient current for the bias circuit 13 to activate the clamp circuit 14. Thus, when the clamp circuit 14 is turned on and the shunt current $I_{SHUNT}$ is flowing due to the transient overstress event, the sense feedback circuit 15 can provide positive feedback that can maintain the clamp circuit 14 turned on for substantially the full duration of the transient overstress event. For instance, in certain implementations, the positive feedback can maintain the clamp circuit 14 turned on for 90% or more of the duration of the transient overstress event.

The sense feedback circuit 15 can provide positive feedback to an input of the bias circuit 13. Since the bias circuit 13 controls activation of the clamp circuit 14, the positive feedback can be used to maintain the clamp circuit 14 turned on for the duration that the overstress event is present between the first and second nodes 1, 2. Thus, the duration that the clamp circuit 14 is turned on need not be limited by a time constant of the transient detection circuit 11, such as an RC time constant of a triggering network. Furthermore, in configurations in which the transient detection circuit 11 and/or bias circuit 13 includes one or more bipolar transistors, the duration that the clamp circuit 14 is turned on for need not be limited by parasitic base-to-collector capacitances associated with such bipolar transistors operating in saturation.

Accordingly, the sense feedback circuit 15 can provide the protection circuit 20 with a turn on time that can dynamically change based on the duration of the transient overstress event. For example, even when the transient overstress event is relatively long, the positive feedback provided by the sense feedback circuit 15 can maintain the clamp circuit 14 turned on for the event's full duration. Thus, the protection circuit 20 can be used to safely discharge a trailing edge of an ESD event to avoid voltage build-up.

In contrast, a protection device that sets a duration that a clamp circuit is turned on based on an RC time constant may be unable to maintain the clamp circuit turned on for a full duration of an ESD event, which can lead to damage of certain devices, such as small geometry devices and/or high speed devices susceptible to overvoltage conditions. For example, prematurely turning off the clamp circuit may damage, for example, metal oxide semiconductor (MOS) transistors having a gate length of 28 nm or less and/or heterojunction bipolar transistors such as silicon germanium (SiGe) bipolar transistors.

Although FIG. 1 illustrates particular polarities of the detection current $I_{DET}$, the positive feedback current $I_{PFBK}$, and the combined current $I_{COMBINED}$, in certain configurations, the polarity of each current can be reversed.

Figure 2:
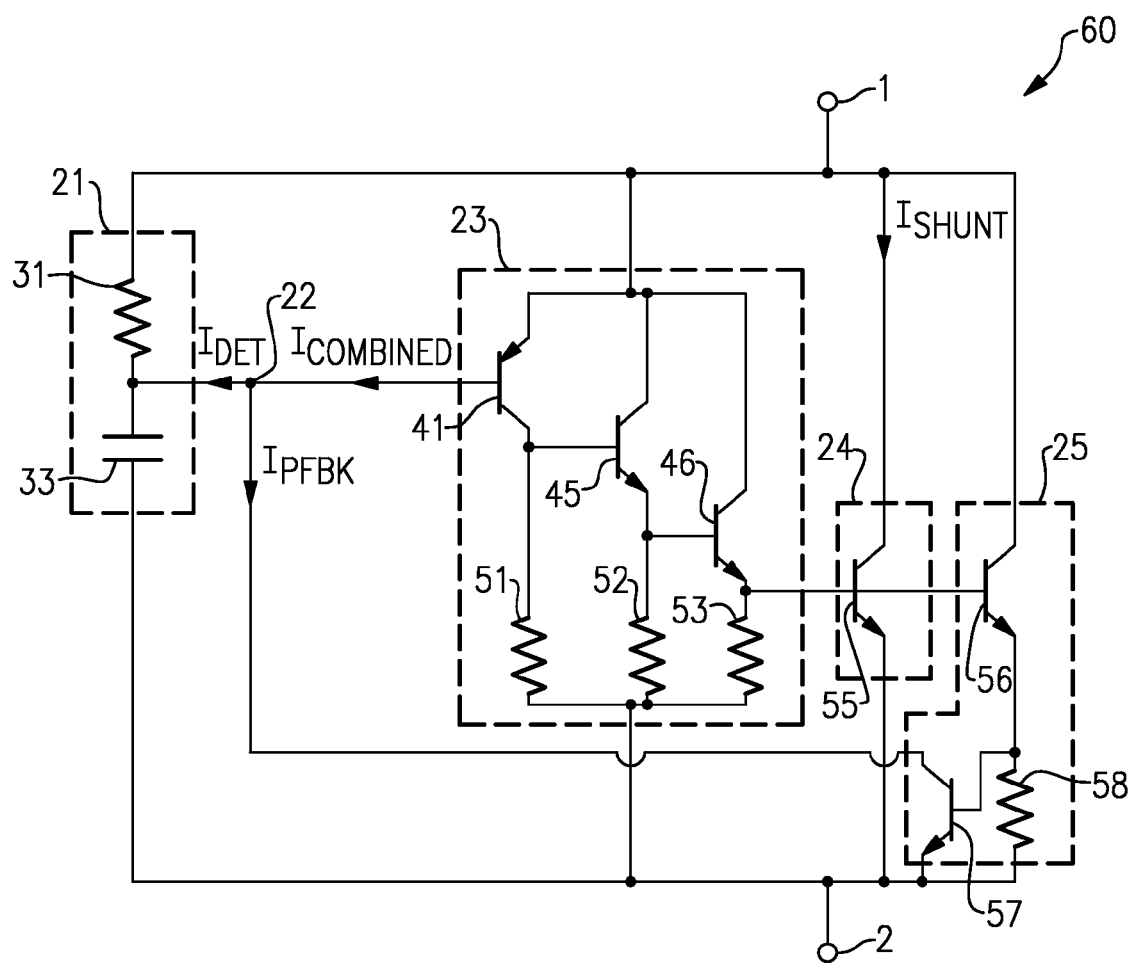
FIG. 2 is a circuit diagram of an actively-controlled protection circuit according to one embodiment.

FIG. 2 is a circuit diagram of an actively-controlled protection circuit 60 according to one embodiment. The protection circuit 60 includes a transient detection circuit 21, a bias circuit 23, a clamp circuit 24, and a sense feedback circuit 25. The protection circuit 60 is electrically connected between the first node 1 and the second node 2, and includes a current summing node 22 that sums a detection current $I_{DET}$ and a positive feedback current $I_{PFBK}$ to generate a combined current $I_{COMBINED}$.

The transient detection circuit 21 includes a detection resistor 31 and a detection capacitor 33. The detection resistor 31 includes a first end electrically connected to the first node 1 and a second end electrically connected to the current summing node 22. The detection capacitor 33 includes a first end electrically connected to the current summing node 22 and a second end electrically connected to the second node 2.

The bias circuit 23 includes a PNP bias transistor 41, a first NPN bias transistor 45, a second NPN bias transistor 46, a first bias resistor 51, a second bias resistor 52, and a third bias resistor 53. The PNP bias transistor 41 includes an emitter electrically connected to the first node 1, a base electrically connected to the current summing node 22, and a collector electrically connected to a base of the first NPN bias transistor 45 and to a first end of the first bias resistor 51. The first NPN bias transistor 45 further includes a collector electrically connected to the first node 1 and an emitter electrically connected to a base of the second NPN bias transistor 46 and to a first end of the second bias resistor 52. The second NPN bias transistor 46 further includes a collector electrically connected to the first node 1 and an emitter electrically connected to a first end of the third bias resistor 53 at an output of the bias circuit 23. The first bias resistor 51, the second bias resistor 52, and the third bias resistor 53 each further include a second end electrically connected to the second node 2.

The clamp circuit 24 includes an NPN clamp transistor 55. The NPN clamp transistor 55 includes a collector electrically connected to the first node 1, a base electrically connected to the output of the bias circuit 23, and an emitter electrically connected to the second node 2.

The sense feedback circuit 25 includes a first NPN sense feedback transistor 56, a second NPN sense feedback transistor 57, and a sense feedback resistor 58. The first NPN sense feedback transistor 56 includes a collector electrically connected to the first node 1, a base electrically connected to the output of the bias circuit 23, and an emitter electrically connected to a first end of the sense feedback resistor 58 and to a base of the second NPN sense feedback transistor 57. The sense feedback resistor 58 further includes a second end electrically connected to the second node 2. The second NPN sense feedback transistor 57 further includes an emitter electrically connected to the second node 2 and a collector electrically connected to the current summing node 22 and configured to generate the positive feedback current $I_{PFBK}$.

The transient detection circuit 21 can be used to detect a transient overstress event having a particular rate of voltage change. For example, prior to the arrival of the transient overstress event, the voltage across the detection capacitor 33 can be about equal to a nominal voltage difference between the first and second nodes 1, 2. Additionally, when the first node 1 experiences a rate of voltage change dV/dt relative to the second node 2, a displacement current having a magnitude about equal to C*dV/dt can flow through the detection resistor 31 and into the detection capacitor 33. When the rate of voltage change is of sufficient magnitude and duration, the flow of displacement current through the detection resistor 31 can forward bias the base-to-emitter junction of the PNP bias transistor 41. Thereafter, a detection current $I_{DET}$ can flow into the detection capacitor 33 until the voltage of the current summing node 22 is about equal to the voltage of the first node 1.

In one embodiment, the capacitance of the detection capacitor 33 is selected to be in the range of about 0.5 pF to about 5 pF, and the resistance of the detection resistor 31 is selected to be in the range of about 10 kΩ to about 500 kΩ. In certain implementations, a magnitude of the detection current $I_{DET}$ can be based in part on an area or size of the PNP bias transistor 41.

When the detection current $I_{DET}$ is activated, the bias circuit 23 can amplify the detection current $I_{DET}$ to generate a clamp bias current at the bias circuit's output to turn on the NPN clamp transistor 55. In the illustrated configuration, the bias circuit 23 includes a cascade of bipolar transistors that can be used to amplify the detection current $I_{DET}$ to generate the clamp bias current. Configuring the bias circuit 23 in this manner can increase the bias circuit's current gain, which can help provide the protection circuit 60 with a relatively fast activation time. Although a specific implementation of a bias circuit is illustrated, the bias circuit can be implemented in other ways, including, for example, configurations with more or fewer transistors arranged in the cascade. For example, increasing the number of gain stages of the bias circuit 23 can increase current gain.

In the illustrated configuration, the collector and the base of the first NPN sense feedback transistor 56 are electrically connected to the collector and the base of the NPN clamp transistor 55. Additionally, when the shunt current $I_{SHUNT}$ is flowing through the NPN clamp transistor 55, a current can also flow through the first NPN sense feedback transistor 56. For example, the current through the first NPN sense feedback transistor 56 can correspond to a scaled replica of the shunt current $I_{SHUNT}$. The first NPN sense feedback transistor's current can flow through the sense feedback resistor 58, which can activate the second NPN sense feedback transistor 57 when a voltage drop across the sense feedback resistor 58 is sufficient to forward bias the second NPN sense feedback transistor's base-to-emitter junction. Thereafter, the second NPN sense feedback transistor 57 can generate the positive feedback current $I_{PFBK}$.

Thus, when the shunt current $I_{SHUNT}$ is sufficiently large, the positive feedback current $I_{PFBK}$ can be activated. After passage of the transient overstress event between the first and second nodes 1, 2, the shunt current $I_{SHUNT}$ can have a relatively small magnitude. Additionally, the current through the first NPN sense feedback transistor 56 can generate a voltage across the sense feedback resistor 58 that is insufficient to forward bias the second NPN sense feedback transistor's base-to-emitter junction. Thus, the positive feedback current $I_{PFBK}$ can deactivate after passage of the transient overstress event, which in turn can result in the bias circuit 23 turning off the clamp circuit 24.

Accordingly, the active feedback provided by the sense feedback circuit 25 can provide the protection circuit 60 with a turn on time that dynamically changes based on the duration of the transient overstress event. Additional details of the protection circuit 60 can be similar to those described earlier.

Figure 3:
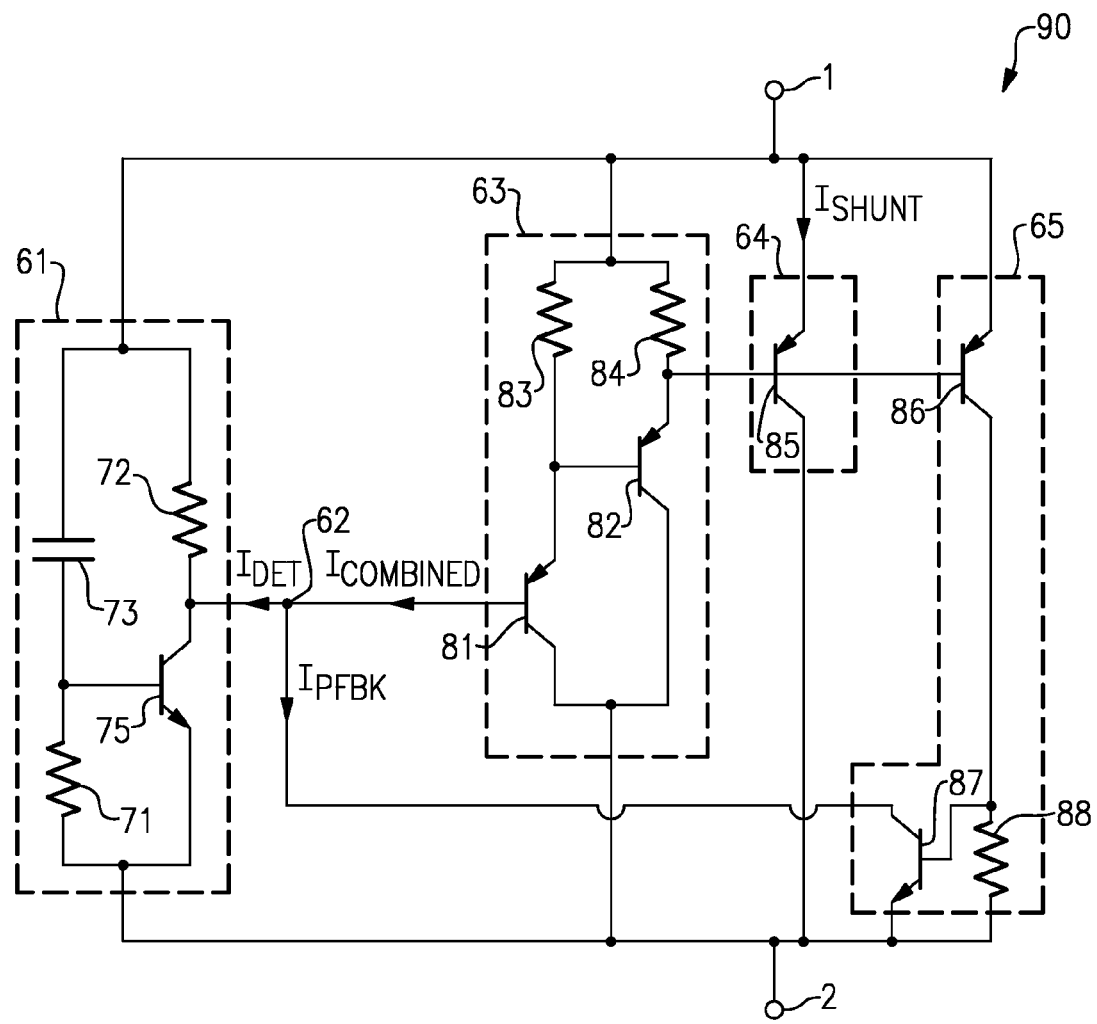
FIG. 3 is a circuit diagram of an actively-controlled protection circuit according to another embodiment.

FIG. 3 is a circuit diagram of an actively-controlled protection circuit 90 according to another embodiment. The protection circuit 90 includes a transient detection circuit 61, a bias circuit 63, a clamp circuit 64, and a sense feedback circuit 65. The protection circuit 90 is electrically connected between the first node 1 and the second node 2, and includes a current summing node 62 that sums a detection current $I_{DET}$ and a positive feedback current $I_{PFBK}$ to generate a combined current $I_{COMBINED}$.

The transient detection circuit 61 includes a first detection resistor 71, a second detection resistor 72, a detection capacitor 73, and an NPN detection transistor 75. The detection capacitor 73 includes a first end electrically connected to the first node 1 and a second end electrically connected to a base of the NPN detection transistor 75. The first detection resistor 71 includes a first end electrically connected to the base of the NPN detection transistor 75 and a second end electrically connected to the second node 2. The NPN detection transistor 75 further includes an emitter electrically connected to the second node 2 and a collector electrically connected to the current summing node 62. The second detection resistor 72 includes a first end electrically connected to the first node 1 and a second end electrically connected to the current summing node 62.

The bias circuit 63 includes a first PNP bias transistor 81, a second PNP bias transistor 82, a first bias resistor 83, and a second bias resistor 84. The first PNP bias transistor 81 includes a base electrically connected to the current summing node 62, a collector electrically connected to the second node 2, and an emitter electrically connected to a base of the second PNP bias transistor 82 and to a first end of the first bias resistor 83. The second PNP bias transistor 82 further includes a collector electrically connected to the second node 2 and an emitter electrically connected to a first end of the second bias resistor 84 at an output of the bias circuit 63. The first bias resistor 83 and the second bias resistor 84 each further include a second end electrically connected to the first node 1.

The clamp circuit 64 includes a PNP clamp transistor 85. The PNP clamp transistor 85 includes a collector electrically connected to the second node 2, a base electrically connected to the output of the bias circuit 63, and an emitter electrically connected to the first node 1.

The sense feedback circuit 65 includes a PNP sense feedback transistor 86, an NPN sense feedback transistor 87, and a sense feedback resistor 88. The PNP sense feedback transistor 86 includes a base electrically connected to the output of the bias circuit 63, an emitter electrically connected to the first node 1, and a collector electrically connected to a first end of the sense feedback resistor 88 and to a base of the NPN sense feedback transistor 87. The sense feedback resistor 88 further includes a second end electrically connected to the second node 2. The NPN sense feedback transistor 87 further includes an emitter electrically connected to the second node 2 and a collector electrically connected to the current summing node 62 and configured to generate the positive feedback current $I_{PFBK}$.

Prior to the arrival of a transient overstress event between the first and second nodes 1, 2, the base voltage of NPN detection transistor 75 can be about equal to the voltage of the second node 2 and the NPN detection transistor 75 can be turned off. Additionally, when a transient overstress event causes the voltage of the first node 1 to increase relative to the voltage of the second node 2, a displacement current can flow through the detection capacitor 73 and through the first detection resistor 71. When the rate of voltage change is of sufficient magnitude and duration, the flow of displacement current through the first detection resistor 71 can forward bias the base-to-emitter junction of the NPN detection transistor 75, thereby turning on the NPN detection transistor 75 and generating the detection current $I_{DET}$.

When the detection current $I_{DET}$ is activated, the bias circuit 63 can amplify the detection current $I_{DET}$ to generate a clamp bias current at the bias circuit's output that can turn on the PNP clamp transistor 85. Additionally, when the shunt current $I_{SHUNT}$ is flowing through the PNP clamp transistor 85, a current can flow through the PNP sense feedback transistor 86 and into the sense feedback resistor 88. Additionally, the NPN sense feedback transistor 87 can activate to generate the positive feedback current $I_{PFBK}$ when a voltage drop across the sense feedback resistor 88 is sufficient to forward bias the NPN sense feedback transistor's base-to-emitter junction.

Accordingly, when the shunt current $I_{SHUNT}$ is sufficiently large, the sense feedback circuit 65 can generate the positive feedback current $I_{PFBK}$. The positive feedback current $I_{PFBK}$ can maintain the clamp circuit 64 turned on, even after the transient detection circuit 61 deactivates the detection current $I_{DET}$. Additionally, when the transient overstress event completes and the shunt current $I_{SHUNT}$ has a relatively small magnitude, the current through the PNP sense feedback transistor 86 can generate a voltage across the sense feedback resistor 88 that is insufficient to forward bias the NPN sense feedback transistor's base-to-emitter junction. Thus, the positive feedback current $I_{PFBK}$ can deactivate after passage of the transient overstress event, which in turn can result in the bias circuit 63 turning off the clamp circuit 64.

Accordingly, the active feedback provided by the sense feedback circuit 65 can provide the protection circuit 90 with an activation time that is dynamically adapted to the transient overstress event's duration. Additional details of the protection circuit 90 can be similar to those described earlier.

Figure 4:
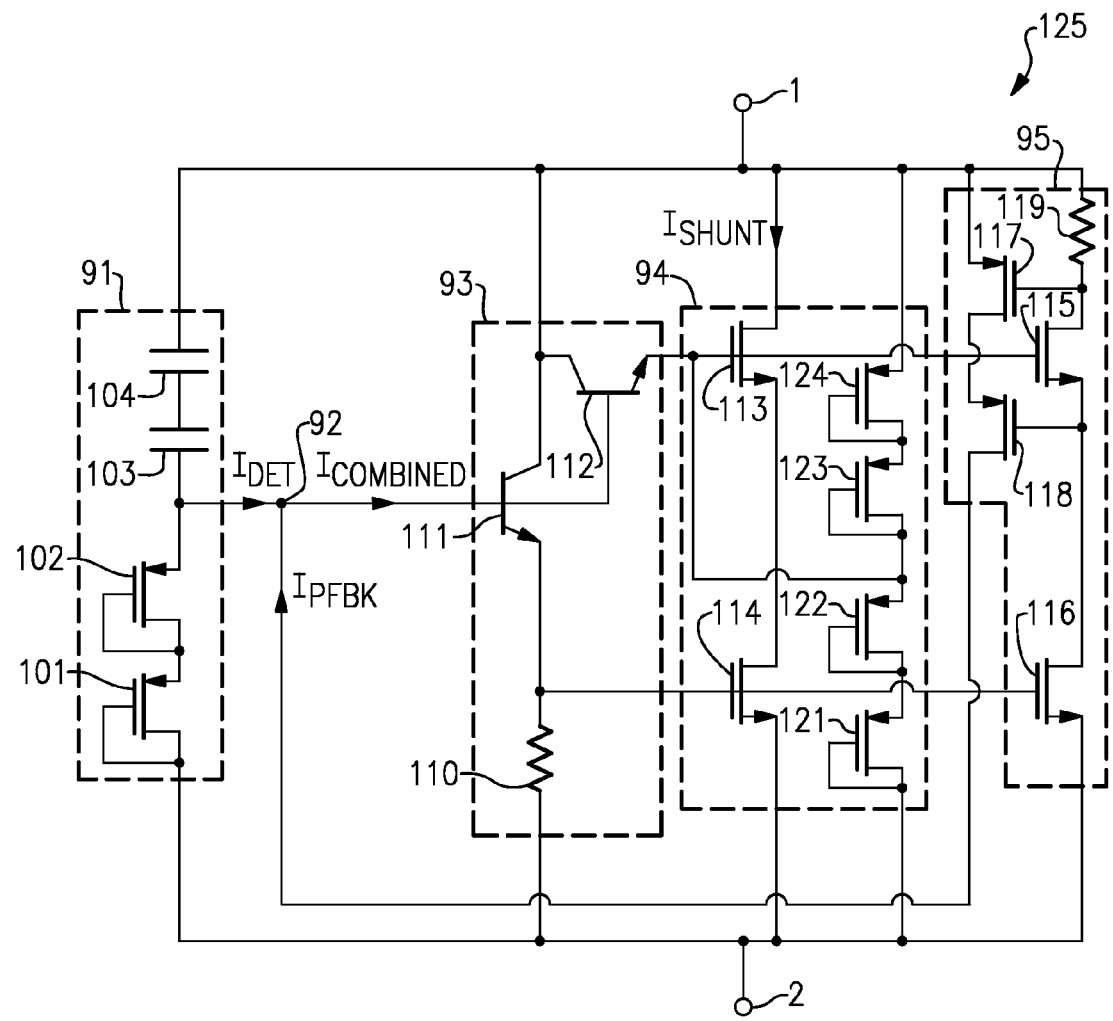
FIG. 4 is a circuit diagram of an actively-controlled protection circuit according to another embodiment.

FIG. 4 is a circuit diagram of an actively-controlled protection circuit 125 according to another embodiment. The protection circuit 125 includes a transient detection circuit 91, a bias circuit 93, a clamp circuit 94, and a sense feedback circuit 95. The protection circuit 125 is electrically connected between the first node 1 and the second node 2, and includes a current summing node 92 that sums a detection current $I_{DET}$ and a positive feedback current $I_{PFBK}$ to generate a combined current $I_{COMBINED}$.

The transient detection circuit 91 includes a first p-type metal oxide semiconductor (PMOS) detection transistor 101, a second PMOS detection transistor 102, a first detection capacitor 103, and a second detection capacitor 104. As persons having ordinary skill in the art will appreciate, MOS transistors can have gates made out of materials other than metals, such as polycrystalline silicon, and can have dielectric "oxide" regions made from dielectrics other than silicon oxide, such as from silicon nitride or high-k dielectrics.

The first and second detection capacitors 103, 104 are electrically connected in series between the first node 1 and the current summing node 92. Additionally, the first and second PMOS detection transistors 101, 102 are diode-connected and electrically connected in series between the second node 2 and the current summing node 92. For example, the first PMOS detection transistor 101 includes a drain and gate electrically connected to the second node 2 and a source electrically connected to a gate and a drain of the second PMOS detection transistor 102. Additionally, the second PMOS detection transistor 102 further includes a source electrically connected to the current summing node 92.

The bias circuit 93 includes a first NPN bias transistor 111, a second NPN bias transistor 112, and a bias resistor 110. The second NPN bias transistor 112 includes a base electrically connected to the current summing node 92, a collector electrically connected to the first node 1, and an emitter electrically connected to a first output of the bias circuit 93. The first NPN bias transistor 111 includes a base electrically connected to the current summing node 92, a collector electrically connected to the first node 1, and an emitter electrically connected to a first end of the bias resistor 110 at a second output of the bias circuit 93. The bias resistor 110 further includes a second end electrically connected to the second node 2.

The clamp circuit 94 includes a first n-type metal oxide semiconductor (NMOS) clamp transistor 113, a second NMOS clamp transistor 114, and first to fourth PMOS transistors 121-124, respectively. The first NMOS clamp transistor 113 includes a drain electrically connected to the first node 1, a gate electrically connected to the first output of the bias circuit 93, and a source electrically connected to a drain of the second NMOS clamp transistor 114. The second NMOS clamp transistor 114 further includes a gate electrically connected to the second output of the bias circuit 93 and a source electrically connected to the second node 2.

The first to fourth PMOS transistors 121-124 are electrically connected in series between the first node 1 and the second node 2. Additionally, the first to fourth PMOS transistors 121-124 are diode-connected and arranged as a voltage divider to bias the gate of the first NMOS clamp transistor 113 when the clamp circuit 94 is deactivated. The first PMOS transistor 121 includes a gate and a drain electrically connected to the second node 2 and a source electrically connected to a gate and a drain of the second PMOS transistor 122. Additionally, the second PMOS transistor 122 further includes a source electrically connected to the gate of the first NMOS clamp transistor 113 and to a drain and a gate of the third PMOS transistor 123. Furthermore, the third PMOS transistor 123 further includes a source electrically connected to a gate and a drain of the fourth PMOS transistor 124. Additionally, the fourth PMOS transistor 124 further includes a source electrically connected to the first node 1.

The first to fourth PMOS transistors 121-124 can aid in controlling a gate bias voltage of the first NMOS clamp transistor 113 when the clamp circuit 94 is turned off. Additionally, in configurations in which a nominal voltage difference between the first and second nodes 1, 2 is relatively large, the first to fourth PMOS transistors 121-124 can help protect the first NMOS clamp transistor 113 from high voltage damage by helping to control the first NMOS clamp transistor's gate-to-drain and gate-to-source voltages.

The sense feedback circuit 95 includes a first NMOS sense feedback transistor 115, a second NMOS sense feedback transistor 116, a first PMOS sense feedback transistor 117, a second PMOS sense feedback transistor 118, and a sense feedback resistor 119. The first NMOS sense feedback transistor 115 includes a gate electrically connected to the first output of the bias circuit 93, a drain electrically connected to a gate of the first PMOS sense feedback transistor 117 and to a first end of the sense feedback resistor 119, and a source electrically connected to a gate of the second PMOS sense feedback transistor 118 and to a drain of the second NMOS sense feedback transistor 116. The sense feedback resistor 119 further includes a second end electrically connected to the first node 1. The second NMOS sense feedback transistor 116 further includes a gate electrically connected to the second output of the bias circuit 93 and a source electrically connected to the second node 2. The first PMOS sense feedback transistor 117 further includes a source electrically connected to the first node 1 and a drain electrically connected to a source of the second PMOS sense feedback transistor 118. The second PMOS sense feedback transistor 118 further includes a drain electrically connected to the current summing node 92 and configured to generated the positive feedback current $I_{PFBK}$.

In certain configurations, a nominal voltage difference between the first node 1 and the second node 2 can be greater than a breakdown voltage of a particular device, such as a MOS transistor. For example, the first node 1 and the second node 2 can correspond to a power high supply voltage and a power low supply voltage, respectively, and a nominal voltage difference between the power high and low supplies may be greater than a gate-to-source breakdown voltage and/or a gate-to-drain breakdown voltage associated with MOS transistors of the fabrication process in which the protection circuit 125 is manufactured. To reduce a voltage drop across such voltage-sensitive devices, the devices can be arranged in series or stacked. In the illustrated configuration, the protection circuit 125 includes MOS transistors and capacitors that have been placed in series in this manner to prevent overvoltage conditions. Alternative embodiments can use higher voltage devices such that the series arrangement is not needed and for example, a single capacitor can be substituted for the first and second detection capacitors 103, 104.

The first and second PMOS detection transistors 101, 102 are diode-connected to operate as a resistor. When a transient overstress event causes the voltage of the first node 1 to increase relative to the voltage of the second node 2, a displacement current can flow through the first and second detection capacitors 103, 104 and through the first and second PMOS detection transistors 101, 102. Thereafter, a voltage drop across the first and second PMOS detection transistors 101, 102 can forward the base-to-emitter junction of the first NPN bias transistor 111, and the detection current $I_{DET}$ can flow from the transient detection circuit 91.

In response to the detection current $I_{DET}$, the bias circuit 93 can generate a first bias voltage for activating the first NMOS clamp transistor 113 and a second bias voltage for activating the second NMOS clamp transistor 114. Thereafter, the shunt current $I_{SHUNT}$ can flow through a low impedance path of the clamp circuit 94 associated with the channels of the first and second NMOS clamp transistors 113, 114.

When the shunt current $I_{SHUNT}$ is flowing, a current can also flow through the first and second NMOS sense feedback transistors 115, 116 and the sense feedback resistor 119. When the shunt current $I_{SHUNT}$ has a sufficient magnitude, the voltage drop across the sense feedback resistor 119 can be large enough to turn on the first PMOS sense feedback transistor 117 and result in a flow of the positive feedback detection current $I_{PFBK}$ from the drain of the second PMOS sense feedback transistor 118.

While the transient overstress event is present, the active feedback provided by the sense feedback circuit 95 can maintain the clamp circuit 94 turned on. Additional details of the protection circuit 125 can be similar to those described earlier.

Figure 5:
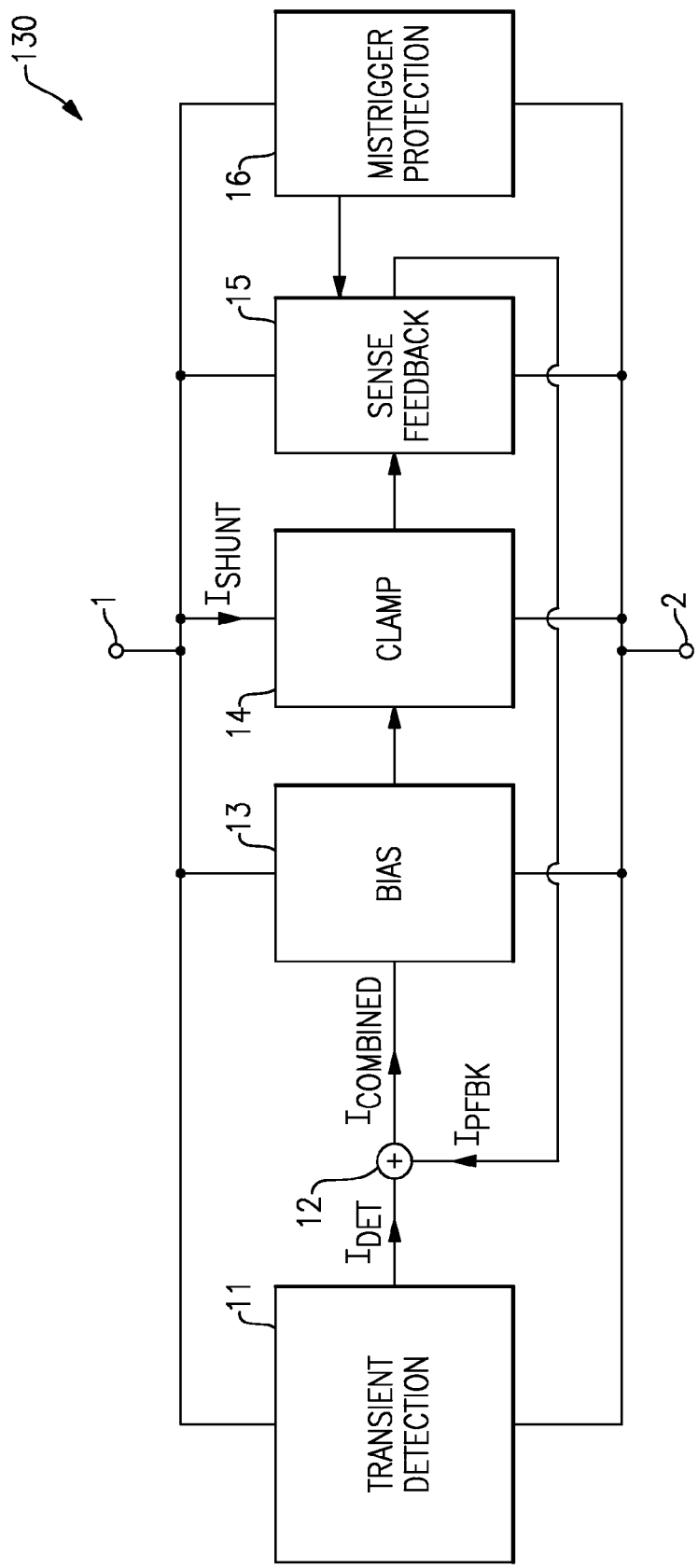
FIG. 5 is a schematic block diagram of an actively-controlled protection circuit according to another embodiment.

FIG. 5 is a schematic block diagram of an actively-controlled protection circuit 130 according to another embodiment. The protection circuit 130 includes the transient detection circuit 11, the current combining node 12, the bias circuit 13, the clamp circuit 14, and the sense feedback circuit 15, which can be as described earlier with reference to FIG. 1. Additionally, the protection circuit 130 further includes a mistrigger protection circuit 16.

The protection circuit 130 of FIG. 5 is similar to the protection circuit 20 of FIG. 1, except that the protection circuit 130 further includes the mistrigger protection circuit 16, which provides a mistrigger protection signal to the sense feedback circuit 15. The mistrigger protection signal can be used to reduce or block the sense feedback circuit 15 from generating the positive feedback current $I_{PFBK}$ when a transient overstress event is not present, thereby helping to prevent certain transient signaling conditions on the first and second nodes 1, 2 from inadvertently activating the protection circuit 130.

For example, absent a mistrigger protection scheme, a transient signal associated with normal signaling conditions, such as a transient signal associated with IC power-up, may couple into an input of the bias circuit 13 and activate the sense feedback circuit 15, which in turn may activate the positive feedback current $I_{PFBK}$ and turn on the clamp circuit 14.

Thus, the mistrigger protection circuit 16 provides the mistrigger protection signal to the sense feedback circuit 15, thereby helping to prevent unintended activation of the protection circuit 130 during normal transient activity on the first and second nodes 1,2. Additionally, the mistrigger protection circuit 16 can deactivate the mistrigger protection signal during a transient overstress event. Configuring the mistrigger protection circuit 16 in this manner can prevent the mistrigger protection circuit 16 from hindering the operation of the protection circuit 130 when a transient overstress event is present between the first and second nodes 1, 2.

Figure 6:
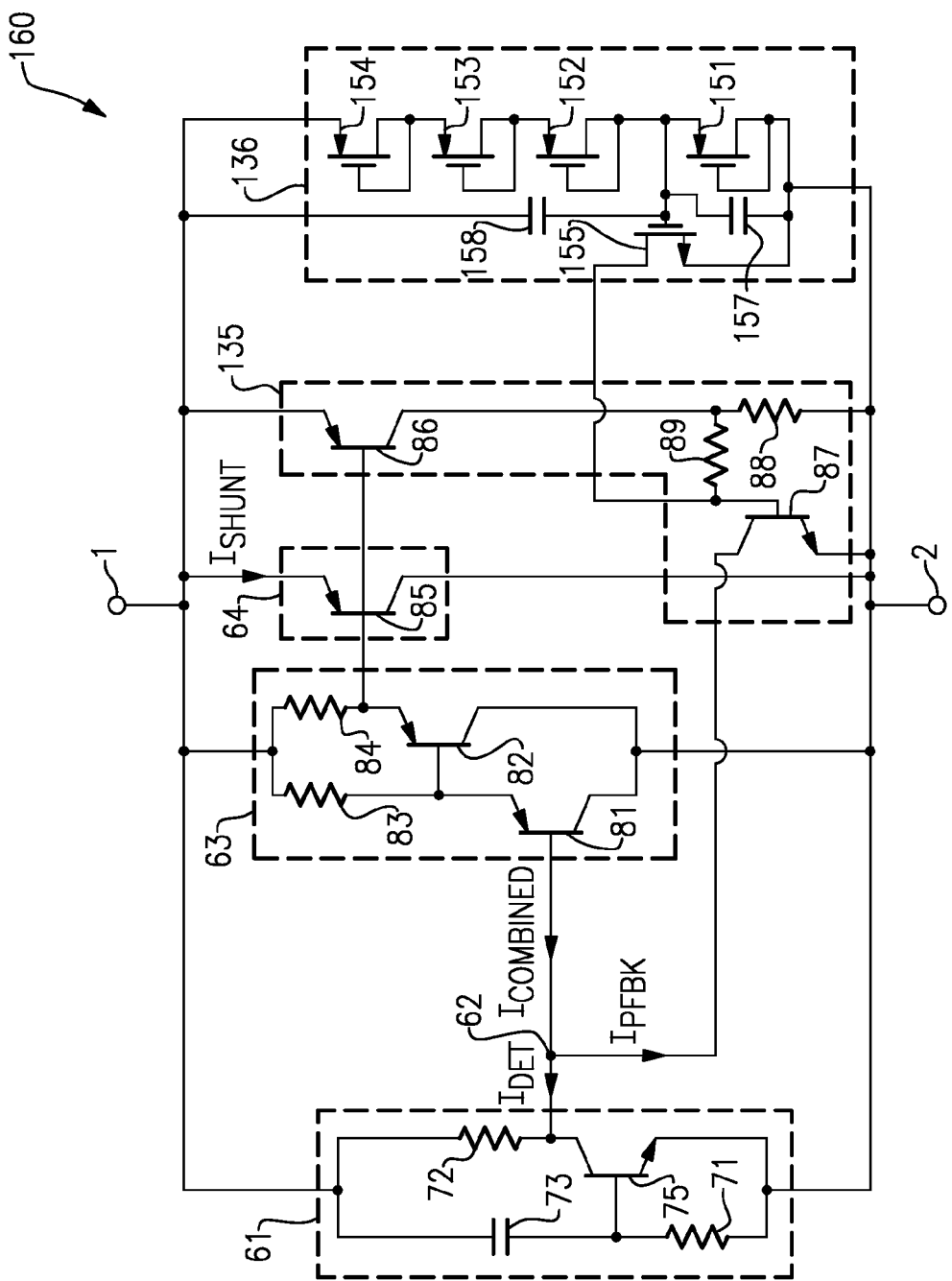
FIG. 6 is a circuit diagram of an actively-controlled protection circuit according to another embodiment.

FIG. 6 is a circuit diagram of an actively-controlled protection circuit 160 according to another embodiment. The protection circuit 160 includes the transient detection circuit 61, the bias circuit 63, and the clamp circuit 64, which can be as described earlier. The protection circuit 160 further includes a sense feedback circuit 135 and a mistrigger protection circuit 136.

The sense feedback circuit 135 of FIG. 6 is similar to the sense feedback circuit 65 of FIG. 3, except that the sense feedback circuit 135 further includes a second sense feedback resistor 89, which is electrically connected between the base of the NPN sense feedback transistor 87 and the first end of the first sense feedback resistor 88.

The mistrigger protection circuit 136 includes an NMOS mistrigger protection transistor 155, a first mistrigger protection capacitor 157, a second mistrigger protection capacitor 158, and first to fourth PMOS mistrigger protection transistors 151-154.

The first mistrigger protection capacitor 157 includes a first end electrically connected to the second node 2 and a second end electrically connected to a first end of the second mistrigger protection capacitor 158 and to a gate of the NMOS mistrigger protection transistor 155. The second mistrigger protection capacitor 158 further includes a second end electrically connected to the first node 1. The NMOS mistrigger protection transistor 155 further includes a source electrically connected to the second node 2 and a drain electrically connected to the base of the NPN sense feedback transistor 87.

The first to fourth PMOS mistrigger protection transistors 151-154 are diode-connected and electrically connected in series between the first and second nodes 1, 2. For example, the first PMOS mistrigger protection transistor 151 includes a drain and a gate electrically connected to the second node 2 and a source electrically connected to the gate of the NMOS mistrigger protection transistor 155 and to a drain and a gate of the second PMOS mistrigger protection transistor 152. Additionally, the second PMOS mistrigger protection transistor 152 further includes a source electrically connected to a gate and a drain of the third PMOS mistrigger protection transistor 153. Furthermore, the third PMOS mistrigger protection transistor 153 further includes a source electrically connected to a gate and a drain of the fourth PMOS mistrigger protection transistor 154. Additionally, the fourth PMOS mistrigger protection transistor 154 further includes a source electrically connected to the first node 1.

The first to fourth PMOS mistrigger protection transistors 151-154 operate as a voltage divider to bias the gate of the NMOS mistrigger protection transistor 155. During normal signaling conditions on the first and second nodes 1, 2, the first to fourth PMOS mistrigger protection transistors 151-154 bias the NMOS mistrigger protection transistor 155 to be turned on, which in turn pulls down the base voltage of the NPN sense feedback transistor 87 to prevent the sense feedback circuit 135 from inadvertently generating the positive feedback current $I_{PFBK}$ during normal operation.

However, when a transient overstress event is received between the first and second nodes 1, 2, the first and second mistrigger protection capacitors 157, 158 can operate as a voltage divider to high frequency components associated with the transient overstress event. Additionally, a ratio of the capacitances of the first and second mistrigger protection capacitors 157, 158 can be selected such that the voltage provided by the first and second mistrigger protection capacitors 157, 158 to the gate of the NMOS mistrigger protection transistor 155 during the transient overstress event turns off the NMOS mistrigger protection transistor 155. For example, in certain implementations, the first mistrigger protection capacitor 157 has a capacitance that is a factor of about 2 times to about 20 times greater than a capacitance of the second mistrigger protection capacitor 158. However, other configurations are possible.

Accordingly, the first and second mistrigger protection capacitors 157, 158 can turn off the NMOS mistrigger protection transistor 155 during a transient overstress event.

However, the first and second mistrigger protection capacitors 157, 158 should not turn off the NMOS mistrigger protection transistor 155 during normal signaling conditions on the first and second nodes 1, 2, including, for example, signaling conditions associated with IC power-up. For example, although a power supply ramp associated with IC power-up is transient in nature, the power supplies can reach a steady-state value. When the power supplies are in the steady-state, the first and second mistrigger protection capacitors 157, 158 should not turn off the NMOS mistrigger protection transistor 155.

Accordingly, the first and second mistrigger protection capacitors 157, 158 can turn off the NMOS mistrigger protection transistor 155 during a transient overstress event, but not during normal signaling conditions on the first and second nodes 1, 2. Rather, in the presence of normal signaling conditions on the first and second nodes 1, 2, the first to fourth NMOS mistrigger protection transistors 151-154 can bias the gate of the NMOS mistrigger protection transistor 155 to turn on the NMOS mistrigger protection transistor 155.

Figure 7:
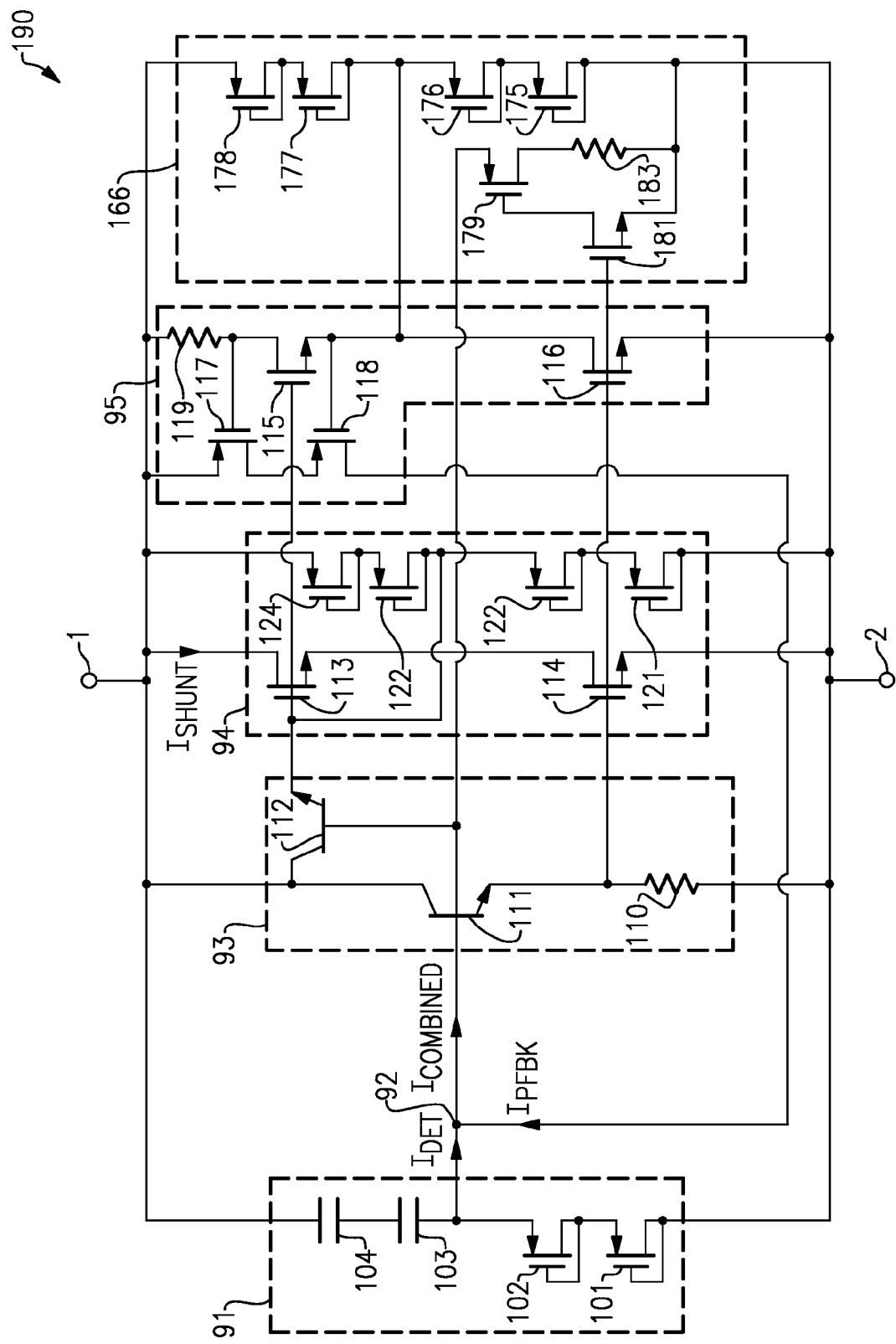
FIG. 7 is a circuit diagram of an actively-controlled protection circuit according to another embodiment.

FIG. 7 is a circuit diagram of an actively-controlled protection circuit 190 according to another embodiment. The protection circuit 190 includes the transient detection circuit 91, the bias circuit 93, the clamp circuit 94, and the sense feedback circuit 95, which can be as described earlier.

The protection circuit 190 of FIG. 7 is similar to the protection circuit 125 of FIG. 4, except that the protection circuit 190 of FIG. 7 further includes a mistrigger protection circuit 166.

The mistrigger protection circuit 166 includes an NMOS mistrigger protection transistor 181, a mistrigger protection resistor 183, and first to fifth PMOS mistrigger protection transistors 175-179, respectively. The NMOS mistrigger protection transistor 181 includes a gate electrically connected to the gate of the second NMOS clamp transistor 114, a source electrically connected to the second node 2, and a drain electrically connected to a gate of the fifth PMOS mistrigger protection transistor 179. The fifth PMOS mistrigger protection transistor 179 further includes a source electrically connected to the current summing node 92 and a drain electrically connected to a first end of the mistrigger protection resistor 183. The mistrigger protection resistor 183 further includes a second end electrically connected to the second node 2.

The first to fourth PMOS mistrigger protection transistors 175-178 are diode-connected and electrically connected in series between the first and second nodes 1, 2. For example, the first PMOS mistrigger protection transistor 175 includes a drain and a gate electrically connected to the second node 2 and a source electrically connected to a drain and a gate of the second PMOS mistrigger protection transistor 176. Additionally, the second PMOS mistrigger protection transistor 176 further includes a source electrically connected to a gate and a drain of the third PMOS mistrigger protection transistor 177 and to the gate of the second PMOS sense feedback transistor 118. Furthermore, the third PMOS mistrigger protection transistor 177 further includes a source electrically connected to a gate and a drain of the fourth PMOS mistrigger protection transistor 178. Additionally, the fourth PMOS mistrigger protection transistor 178 further includes a source electrically connected to the first node 1.

In the presence of normal signaling conditions, the first to fourth PMOS mistrigger protection transistors 175-178 operate as a voltage divider to bias the gate of the second PMOS sense feedback transistor 118 to turn off the second PMOS sense feedback transistor 118 and prevent the sense feedback circuit 95 from generating the positive feedback current $I_{PFBK}$. However, when a transient overstress event increases the voltage of the first node 1 relative to the second node 2, the first and second PMOS sense feedback transistors 117, 118 can turn on and the sense feedback circuit 95 can activate the positive feedback current $I_{PFBK}$.

The fifth PMOS mistrigger protection transistor 179, the NMOS mistrigger protection transistor 181, and the mistrigger protection resistor 183 can help prevent mistrigger of the protection circuit 190 at high temperatures. For example, at high temperatures, for instance 125° C. or more, the base-to-emitter voltage of the first NPN bias transistor 111 can decrease, which can result in unintended activation of the clamp circuit 94. By including the mistrigger protection circuit 166, the base of the first NPN bias transistor 111 can be controlled to a relatively low voltage during normal operation, thereby helping to prevent mistrigger associated with the current summing node 92 reaching a relatively high voltage at high temperature.

FIGS. 8A-8D illustrate schematic block diagrams of various examples of integrated circuits (ICs) in which one or more protection circuits can be included. Although not illustrated for purposes of clarity of the figures, the ICs can include additional pins, circuitry, and/or other structures. Furthermore, although certain example ICs including protection circuits have been shown, the protection circuits herein can be used in conjunction with other configurations of ICs.

Figure 8A:
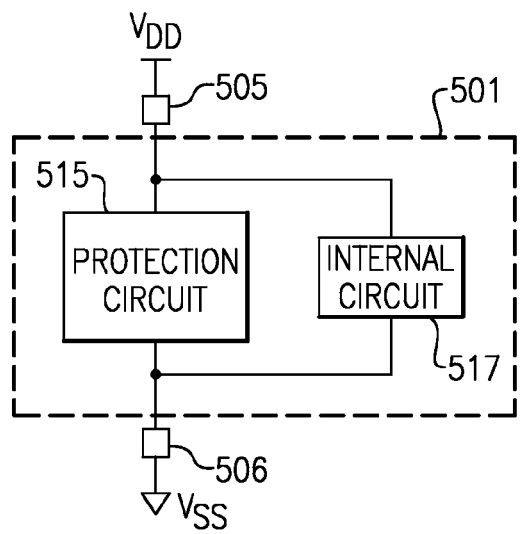
FIGS. 8A-8D illustrate schematic block diagrams of various examples of integrated circuits (ICs) in which one or more protection circuits can be included.

In FIG. 8A, an IC 501 includes a power high supply pin or contact 505, a power low supply pin or contact 506, a protection circuit 515, and an internal circuit 517. The internal circuit 517 is powered using a power high supply voltage received on the power high supply pin 505 and by a power low supply voltage received on the power low supply pin 506. The protection circuit 515 of FIG. 8A is electrically connected between the power high supply pin 505 and the power low supply pin 506. In the illustrated configuration, the power high supply pin 505 corresponds to the first node 1 of FIGS. 1-7 and the power low supply pin 506 corresponds to the second node 2 of FIGS. 1-7.

Figure 8C:
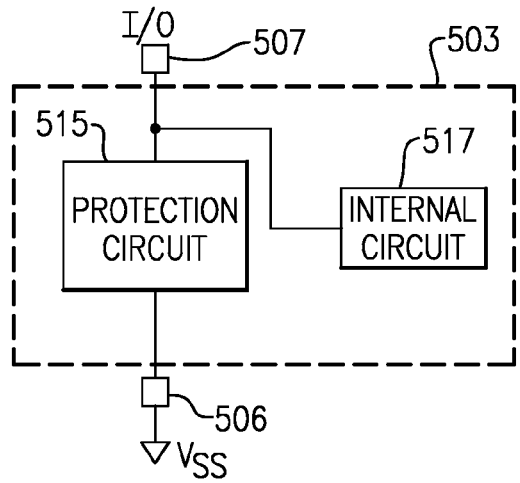
Figure 8B:
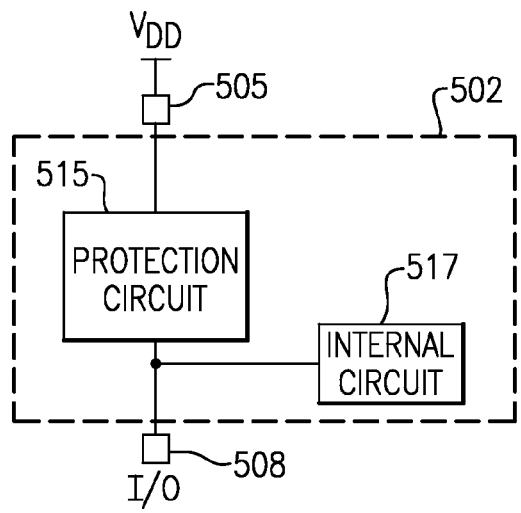

In the configuration shown in FIG. 8B, an IC 502 includes the power high supply pin 505, the protection circuit 515, the internal circuit 517, and an input/output (I/O) pin or contact 508, which can correspond to an input pin and/or an output pin. Thus, the internal circuit 517 can receive and/or transmit signals over the I/O pin 508. The protection circuit 515 of FIG. 8B is electrically connected between the power high supply pin 505 and the I/O pin 508. In the configuration shown in FIG. 8B, the power high supply pin 505 corresponds to the first node 1 of FIGS. 1-7 and the I/O pin 508 corresponds to the second node 2 of FIGS. 1-7.

In FIG. 8C, an IC 503 includes an I/O pin 507, the power low supply pin 506, the protection circuit 515, and the internal circuit 517. The internal circuit 517 can receive and/or transmit signals over the I/O pin 507. The protection circuit 515 of FIG. 8C is electrically connected between the I/O pin 507 and the power low supply pin 506. In the illustrated configuration, the I/O pin 507 corresponds to the first node 1 of FIGS. 1-7 and the power low supply pin 506 corresponds to the second node 2 of FIGS. 1-7.

Figure 8D:
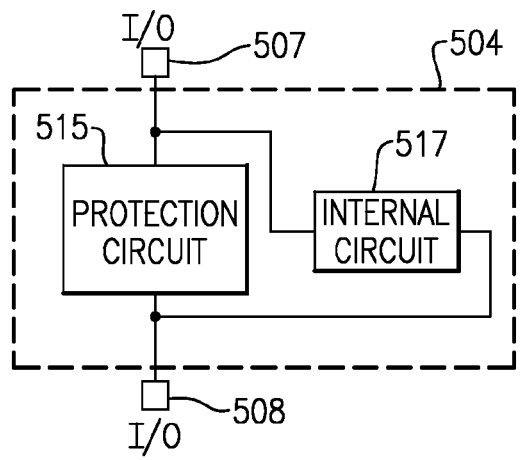

In the configuration shown in FIG. 8D, an IC 504 includes first and second I/O pins 507, 508, the protection circuit 515, and the internal circuit 517. The illustrated protection circuit 515 is electrically connected between the first and second I/O pins 507, 508. In the configuration shown in FIG. 8D, the first I/O pin 507 corresponds to the first node 1 of FIGS. 1-7 and the second I/O pin 508 corresponds to the second node 2 of FIGS. 1-7.

Persons of ordinary skill in the art will appreciate that one or more of the protection circuits described herein can be employed on an IC in order to provide the desired degree of protection against various transient overstress events. For example, an IC can include a number of input pins, output pins, bi-directional pins, power high pins, and power low or ground pins. One or more of these pins can have multiple instantiations of the protection circuit 515, and a single pin can have multiple protection circuits 515.

In certain implementations, the protection circuit 515 can be positioned along one or more signal paths. In order to minimize an adverse effect on the speed of the signal path, it can be desirable for the protection circuit 515 to provide a relatively small amount of capacitive loading. Additionally, it can be desirable for the protection circuit 515 to have an off state in which the circuit conducts at most a relatively small current, in order to minimize leakage power dissipation and static power consumption.

It can also be desirable for the protection circuit 515 to conduct a large current when a transient overstress event satisfying one or more signaling conditions indicative of, for example, high-voltage or high-power is detected. Thus, there is a need for a protection circuit having a relatively small capacitive loading and circuit area, and whose impedance can be modulated by several orders of magnitude over a short amount of time, thereby shunting the charge associated with a high-voltage transient signal event before the IC is exposed to overvoltage conditions or localized power dissipation.

Applications

Devices employing the above described schemes can be implemented into various electronic devices. Examples of the electronic devices can include, but are not limited to, consumer electronic products, parts of the consumer electronic products, electronic test equipment, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
   a transient detection circuit configured to generate a detection current in response to a transient overstress event detected between a first node and a second node;
   a clamp circuit having an on state and an off state and comprising a clamp transistor, wherein a shunt current flows through the clamp transistor between the first node and the second node when the clamp circuit operates in the on state;
   a sense feedback circuit comprising a first sense transistor electrically coupled to the clamp transistor and configured to generate a sense current that is based on the shunt current, and a second sense transistor configured to generate a positive feedback current based on the sense current; and
   a bias circuit configured to receive a combined current, wherein the combined current is based on a sum of the detection current and the positive feedback current, wherein the bias circuit is configured to control operation of the clamp circuit in the on state or the off state based on the combined current.

2. The apparatus of claim 1, wherein the bias circuit is configured to set the clamp circuit in the on state in response to the detection current, and wherein the bias circuit is further configured to maintain the clamp circuit in the on state while the sense feedback circuit generates the positive feedback current.

3. The apparatus of claim 2, wherein the bias circuit is further configured to maintain the clamp circuit in the on state for a time duration that is greater than a time constant of the transient detection circuit.

4. The apparatus of claim 1, wherein the clamp transistor corresponds to a bipolar clamp transistor including a base electrically connected to an output of the bias circuit, wherein the bias circuit is configured to amplify the combined current to generate a base bias current of the bipolar clamp transistor.

5. The apparatus of claim 4, wherein the first sense transistor corresponds to a first bipolar sense feedback transistor including a base electrically connected to the base of the bipolar clamp transistor.

6. The apparatus of claim 5, wherein the second sense transistor corresponds to a second bipolar sense feedback transistor including a collector configured to generate the positive feedback current, wherein the sense current is configured to flow through a sense feedback resistor of the sense feedback circuit to control a base-to-emitter voltage of the second bipolar sense feedback transistor.

7. The apparatus of claim 1, wherein the clamp transistor corresponds to a first MOS clamp transistor including a gate electrically connected to a first output of the bias circuit, wherein the bias circuit is configured to control a gate voltage of the first MOS clamp transistor based on the combined current.

8. The apparatus of claim 7, wherein the first sense transistor corresponds to a first MOS sense feedback transistor including a gate electrically connected to the gate of the first MOS clamp transistor, wherein the second sense transistor corresponds to a second MOS sense feedback transistor including a drain configured to generate the positive feedback current, wherein the sense current is configured to flow through a sense feedback resistor of the sense feedback circuit to control a gate-to-source voltage of the second MOS sense feedback transistor.

9. The apparatus of claim 8, further comprising a mistrigger protection circuit configured to provide a mistrigger protection signal to the sense feedback circuit when the transient overstress event is not present, wherein when the mistrigger protection signal is activated the sense feedback circuit is inhibited from generating the positive feedback current.

10. The apparatus of claim 9, wherein the sense feedback circuit further comprises a third MOS sense feedback transistor electrically connected in series with the second MOS sense feedback transistor, wherein the positive feedback current is configured to flow through the second and third MOS sense feedback transistors, and wherein the mistrigger protection circuit controls a gate voltage of the third MOS sense feedback transistor.

11. The apparatus of claim 7, wherein the clamp circuit further comprises a second MOS clamp transistor electrically connected in series with the first MOS clamp transistor between the first and second nodes, wherein the second MOS clamp transistor includes a gate electrically connected to a second output of the bias circuit.

12. The apparatus of claim 1, further comprising a mistrigger protection circuit, wherein the bias circuit comprises a first bipolar bias transistor including a base configured to receive the combined current, wherein the first bipolar bias transistor is configured to amplify the combined current, wherein the mistrigger protection circuit is further configured to control a base voltage of the bipolar bias transistor to inhibit a mistrigger condition.

13. The apparatus of claim 1, wherein the first node comprises a power high supply pin, and wherein the second node comprises a power low supply pin.

14. The apparatus of claim 1, wherein the sense current is a scaled replica of the shunt current.

15. The apparatus of claim 1, wherein the second sense transistor turns on to generate the positive feedback current when the shunt current is larger than a first magnitude, and turns off when the shunt current is less than the first magnitude.

16. An apparatus comprising:
a transient detection circuit configured to generate a detection current in response to a transient overstress event detected between a first node and a second node;
a clamp circuit having an on state and an off state, wherein a shunt current flows through the clamp circuit between the first node and the second node when the clamp circuit operates in the on state;
a sense feedback circuit configured to generate a positive feedback current based on the current;
a bias circuit configured to receive a combined current, wherein the combined current is based on a sum of the detection current and the positive feedback current, wherein the bias circuit is configured to control operation of the clamp circuit in the on state or the off state based on the combined current; and
a mistrigger protection circuit configured to provide a mistrigger protection signal to the sense feedback circuit when the transient overstress event is not present, wherein when the mistrigger protection signal is activated the sense feedback circuit is inhibited from generating the positive feedback current.

17. The apparatus of claim 16, wherein the mistrigger protection circuit comprises a metal oxide semiconductor (MOS) transistor including a drain configured to generate the mistrigger protection signal, wherein the mistrigger protection circuit further comprises a capacitor voltage divider electrically connected between the first node and the second node, wherein the capacitor voltage divider is configured to control a gate voltage of the MOS transistor.

18. A method for protecting an integrated circuit from transient overstress events, the method comprising:
detecting a presence of a transient overstress event between a first node and a second node using a transient detection circuit;
generating a detection current in response to the transient overstress event using the transient detection circuit;
combining the detection current with a positive feedback current to generate a combined current;
controlling a clamp circuit to an on state or an off state based on the combined current using a bias circuit, wherein a shunt current flows through the clamp circuit between the first node and the second node when the clamp circuit is in the on state;
generating the positive feedback current based on the shunt current using a sense feedback circuit;
generating a mistrigger protection signal when the transient overstress event is not present using a mistrigger protection circuit; and
inhibiting the sense feedback circuit from generating the positive feedback current using the mistrigger protection signal.

19. The method of claim 18, further comprising controlling the clamp circuit to the on state in response to the detection current using the bias circuit, and maintaining the clamp circuit in the on state while the positive feedback current is being generated.

20. The method of claim 18, further comprising turning on the clamp circuit for a duration of time that is independent of a time constant of the transient detection circuit.

* * * * *